United States Patent
McCoy et al.

(10) Patent No.: US 12,398,877 B1
(45) Date of Patent: Aug. 26, 2025

(54) FLUID VAPORIZERS

(71) Applicant: Yield Engineering Systems Inc., Fremont, CA (US)

(72) Inventors: Craig McCoy, San Jose, CA (US); Tapani Laaksonen, Fremont, CA (US); Vladimir Kudriavtsev, Palo Alto, CA (US); Jose Garvey, San Jose, CA (US)

(73) Assignee: Yield Engineering Systems, Inc., Fremont, CA (US)

( * ) Notice: Subject to any disclaimer, the term of this patent is extended or adjusted under 35 U.S.C. 154(b) by 0 days.

(21) Appl. No.: 18/972,485

(22) Filed: Dec. 6, 2024

(51) Int. Cl.
| | | |
|---|---|---|
| B23K 1/20 | (2006.01) | |
| F22B 1/28 | (2006.01) | |
| H01L 23/00 | (2006.01) | |
| B23K 1/008 | (2006.01) | |

(52) U.S. Cl.
CPC ............... F22B 1/288 (2013.01); B23K 1/20 (2013.01); F22B 1/287 (2013.01); H01L 24/75 (2013.01); *B23K 1/008* (2013.01); *H01L 2224/75272* (2013.01)

(58) Field of Classification Search
CPC . F22B 1/288; F22B 1/287; B23K 1/20; B23K 1/008; H01L 2224/75272; H01L 24/75
USPC .......................................................... 392/396
See application file for complete search history.

(56) References Cited

U.S. PATENT DOCUMENTS

| | | | | |
|---|---|---|---|---|
| 2,367,170 | A * | 1/1945 | Fahrenwald | F24H 3/0405 219/385 |
| 3,131,865 | A * | 5/1964 | Roe | F24H 7/0416 165/104.31 |
| 4,439,669 | A * | 3/1984 | Ryffel | F22B 1/30 338/80 |
| 6,339,678 | B1 * | 1/2002 | Sorensen | F22B 1/287 392/386 |
| 7,404,862 | B2 * | 7/2008 | Shtein | C23C 14/228 392/386 |
| 8,554,064 | B1 * | 10/2013 | Dinh | A61M 16/18 392/397 |
| 9,982,341 | B2 * | 5/2018 | Schoepp | F22B 1/282 |
| 2004/0182855 | A1 * | 9/2004 | Centanni | A61L 2/07 392/397 |
| 2015/0377481 | A1 * | 12/2015 | Smith | F22B 1/28 392/401 |

\* cited by examiner

*Primary Examiner* — Jimmy Chou
(74) *Attorney, Agent, or Firm* — Fish & Richardson P.C.

(57) ABSTRACT

A vaporizer apparatus includes a liquid inlet; a plurality of plates in a stacked arrangement and configured with openings and surfaces defining a tortuous path for a liquid through the plurality of plates; an atomizer configured to atomize liquid from the liquid inlet and inject a spray of the liquid toward a first plate of the plurality of plates, wherein the plurality of plates is configured to direct a flow of the liquid through the tortuous path from a first end corresponding to the first plate and output a vapor of the liquid at a second end of the tortuous path corresponding to a last plate of the plurality of plates; and at least one heating element configured to heat the plurality of plates to vaporize the liquid along its flow through the tortuous path and generate the vapor.

29 Claims, 12 Drawing Sheets

FLUID VAPORIZERS

TECHNICAL FIELD

The present disclosure generally relates to material processing systems, e.g., fluid vaporizers for vaporizing liquids.

BACKGROUND

Vapor can be delivered to process chambers for various processes such as etching and material deposition. The vapor can be obtained by vaporizing a liquid.

SUMMARY

Implementations of the present disclosure are generally directed to systems, methods, and devices associated with fluid and materials processing, e.g., fluid vaporizers for vaporizing liquids.

Some aspects of this disclosure relate to a vaporizer apparatus that includes: a liquid inlet; a plurality of plates in a stacked arrangement and configured with openings and surfaces defining a tortuous path for a liquid through the plurality of plates; and an atomizer configured to atomize liquid from the liquid inlet and inject a spray of the liquid toward a first plate of the plurality of plates. The plurality of plates is configured to direct a flow of the liquid through the tortuous path from a first end corresponding to the first plate and output a vapor of the liquid at a second end of the tortuous path corresponding to a last plate of the plurality of plates. The vaporizer apparatus includes at least one heating element configured to heat the plurality of plates to vaporize the liquid along its flow through the tortuous path and generate the vapor.

This and other vaporizer apparatuses described herein can have one or more of at least the following characteristics.

In some implementations, the plurality of plates are stacked with intervening spaces having a specified dimension.

In some implementations, the plurality of plates include two plates in succession along the tortuous path. The two plates are oriented parallel to one another and spaced apart along a stack direction. The two plates include respective openings arranged at different lateral positions.

In some implementations, the respective openings of a first plate of the two plates are arranged more radially inward compared to the respective openings of a second plate of the two plates.

In some implementations, the first plate has a surface exposed to the spray of the liquid.

In some implementations, the plurality of plates are arranged in a first stack and a second stack spaced laterally apart from the first stack. The first plate is closest to the liquid inlet among plates of the first stack. The last plate is closest to the liquid inlet among plates of the second stack.

In some implementations, the plurality of plates includes a first plurality of plates stacked in a first section, and a second plurality of plates stacked in a second section. The first plurality of plates is laterally spaced apart from the second plurality of plates. The first plurality of plates includes openings and surfaces defining a first portion of the tortuous path. The second plurality of plates includes openings and surfaces defining a portion section of the tortuous path.

In some implementations, the vaporizer apparatus includes a divider separating the first plurality of plates from the second plurality of plates. The divider includes an opening that defines a portion of the tortuous path.

In some implementations, the vaporizer apparatus includes a divider separating the first plurality of plates from the second plurality of plates. The divider includes a slot to receive a first heating element of the at least one heating element.

In some implementations, (i) the first plurality of plates and the second plurality of plates include different numbers of plates, (ii) a total dimension of the first plurality of plates along a stack direction is different from a total dimension of the second plurality of plates along the stack direction, or (i) and (ii).

In some implementations, the plurality of plates includes a first type of plate and a second type of plate. The first type of plate and the second type of plate have openings in different lateral positions, and the first type of plate and the second type of plate alternate along the tortuous path.

In some implementations, the vaporizer apparatus includes an enclosure in which the plurality of plates are arranged. An inner sidewall of the enclosure defines the tortuous path in conjunction with the plurality of plates.

In some implementations, the at least one heating element includes at least one cartridge heating extending through two or more of the plurality of plates.

In some implementations, the tortuous path includes: a first portion extending from the first end of the tortuous path with a first overall flow direction; and a second portion extending from the first portion to the second end of the tortuous path with a second overall flow direction. The second overall flow direction is opposite to the first overall flow direction.

In some implementations, the tortuous path switches from a first direction to a second direction opposite the first direction at least twenty times.

In some implementations, the tortuous path is defined in a volume having an overall dimension D along a direction, and the tortuous path has a length at least 3D along the direction.

In some implementations, the vaporizer apparatus is configured to deliver the vapor to a chamber in the absence of a carrier gas.

In some implementations, gas output from the vaporizer apparatus is at least 95% vapor of the liquid.

In some implementations, the liquid inlet is the only fluid inlet of the vaporizer apparatus.

In some implementations, the plurality of plates are separate components from one another.

Some aspects of this disclosure relate to a material processing system that includes: a vessel configured to store a liquid; a pressurizer configured to pressurize the liquid in the vessel; and a vaporizer fluidically coupled to the vessel. The vaporizer includes: a liquid inlet configured to receive the pressurized liquid from the vessel, and a plurality of plates in a stacked arrangement and configured with openings and surfaces defining a tortuous path for the liquid through the plurality of plates. The plurality of plates is configured to direct a flow of the liquid from the liquid inlet through the tortuous path from a first end corresponding to a first plate of the plurality of plates and output a vapor of the liquid at a second end of the tortuous path corresponding to a last plate of the plurality of plates. The vaporizer includes at least one heating element configured to heat the plurality of plates to vaporize the liquid along its flow through the tortuous path and generate the vapor. The material processing system includes a chamber fluidically coupled to the second end of the tortuous path and configured to receive the vapor to perform a material processing operation in the chamber.

This and other material processing systems described herein can have one or more of at least the following characteristics.

In some implementations, the material processing system includes: a fluid valve connected between the vaporizer and the vessel; and a controller configured to pulse the fluid valve to provide the liquid into the vaporizer. The controller is configured to pulse the fluid valve with an on-time in a range from 20 ms to 250 ms and an off-time in a range from 0.5 seconds to 4.0 seconds.

In some implementations, the pressurizer is configured to pressurize the liquid with a pressure in a range from 35 psi to 90 psi.

In some implementations, the vessel is configured to store formic acid as the liquid.

In some implementations, the vaporizer includes an atomizer configured to atomize liquid from the liquid inlet and inject a spray of the liquid toward the first plate.

In some implementations, the plurality of plates includes two plates in succession along the tortuous path. The two plates are oriented parallel to one another and spaced apart. The two plates include respective openings arranged at different lateral positions.

Some aspects of this disclosure relate to a vaporizer apparatus that includes: a plurality of plates in a stacked arrangement and configured with openings and surfaces defining a tortuous path for a liquid through the plurality of plates. The plurality of plates is configured to direct a flow of the liquid through the tortuous path from a first end corresponding to a first plate of the plurality of plates and output a vapor of the liquid at a second end of the tortuous path corresponding to a last plate of the plurality of plates. The vaporizer apparatus includes at least one heating element configured to heat the plurality of plates to vaporize the liquid along its flow through the tortuous path and generate the vapor.

The details of one or more implementations of the subject matter of this disclosure are set forth in the accompanying drawings and the description below. Other features, aspects, and advantages of the subject matter will become apparent from the description, the drawings, and the claims.

DETAILED DESCRIPTION

Figure 1:
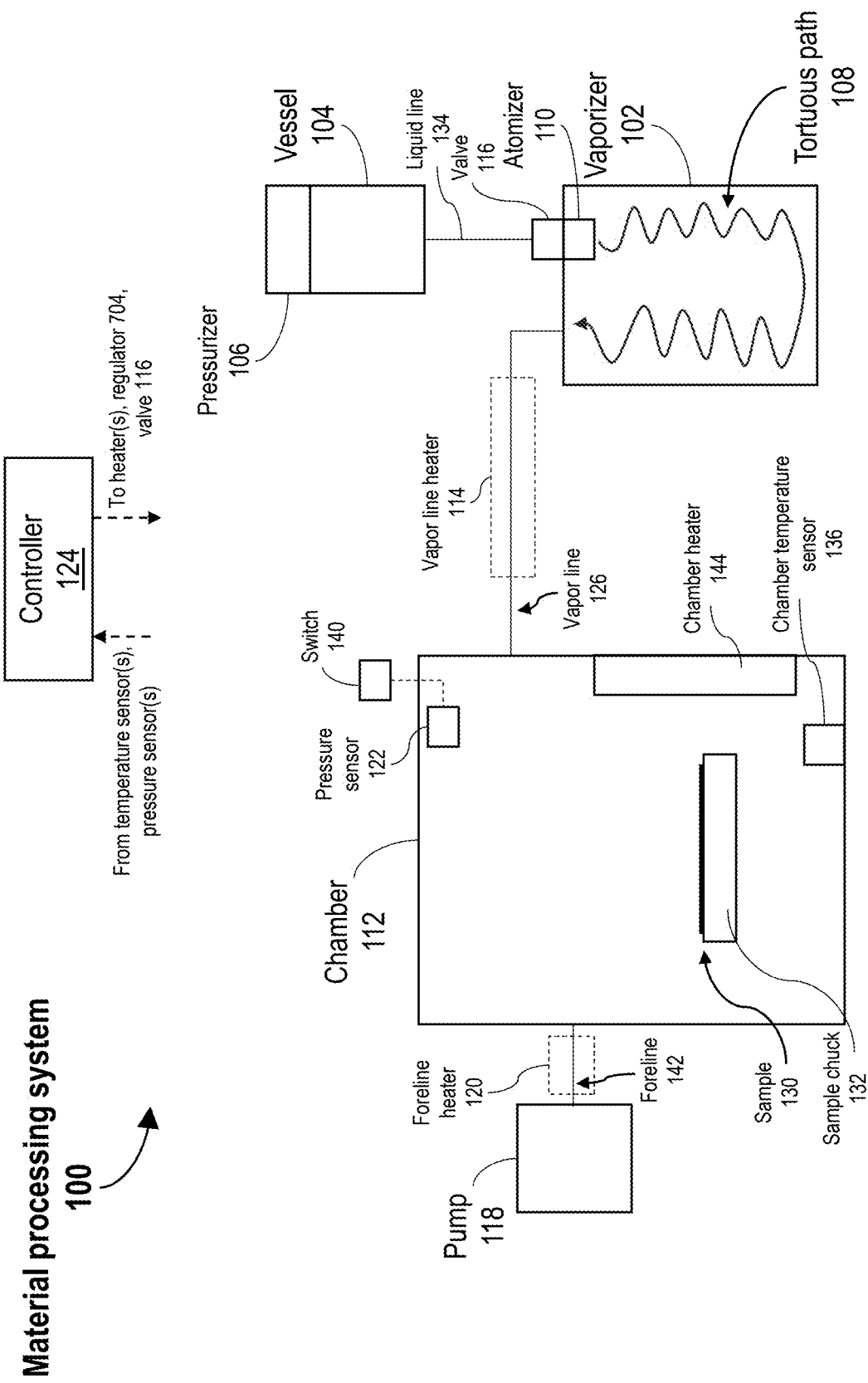
FIG. 1 is a diagram illustrating an example of a material processing systems.

Various aspects of this disclosure describe systems, methods, and devices for materials processing, e.g., fluid vaporizers for vaporizing liquids. An efficient vaporizer can include features (e.g., an atomizer and/or a tortuous path) that result in high flow rates of output vapor, for example, even in the absence of a carrier gas.

As an illustrative example, some aspects of this disclosure can be applied to the use of a suitable chemical fluid (e.g., formic acid, HCOO, among others) for solder reflow. In a solder reflow process, electrical components attached to a substrate (e.g., a circuit board) by a solder paste are placed in a chamber (e.g., an oven) and heated to "reflow" the solder (converting the solder into a molten state) and reform the solder joints, making the joints stronger and permanent. Flux-free reflow processing (providing improved bonds compared to processes that use a flux) can be performed at relatively low temperatures in a formic acid atmosphere. The formic acid vapor chemically reacts with metal oxides (e.g., surface oxides on a metal pad) to form an oxide-free bond. The use of formic acid can reduce or eliminate the need for pre-reflow fluxing and post-reflow flux removal, and provides effective oxide removal at low temperatures for an overall flexible process. For example, a formic acid atmosphere during solder reflow can effectively remove oxide layers from tin.

The effectiveness of formic acid may be a function of a concentration (partial pressure) of formic acid in the chamber. For example, to ensure oxide removal and target processing characteristics, processing (e.g., heating) may be performed only when the chamber has reached a certain minimum partial pressure of formic acid, or has a partial pressure of formic acid within a defined range. However, as circuit system sizes (and, correspondingly, chamber sizes) increase, it may be challenging to achieve target formic acid vapor concentrations while maintaining desired throughput. For example, as elements of the electronics industry transition to the use of glass panels as substrates for heterogeneous integration, chambers with volumes of about 120 L may be used to accommodate systems undergoing solder reflow. For example, the panels may be up to 65 cm in length and width, necessitating large chambers. Conventional vapor delivery systems may provide about 1 mg/s of liquid, a rate incompatible with high-throughput processing using such large chambers.

Moreover, conventional vapor delivery systems may be reliant on the use of a carrier gas, e.g., for liquid/vapor transport and/or for liquid atomization prior to vaporization. However, the presence of a carrier gas directly dilutes the vapor concentration and may be undesirable for chemical reaction processes. Further, the presence of the carrier gas may complicate concentration control, e.g., due to the confounding contribution of the carrier gas on pressure or mass-flow measurements. Also, many conventional vapor delivery systems rely on mass flow controllers (MFC) for mass flow control, resulting in large system volumes for both the MFC and other components (e.g., vaporizers) and complicating overall system design. Conventional vapor delivery systems tend to be low-power, use short paths, and follow limited volumetric vaporization rate designs.

Some vaporizers and associated systems described herein can be used to obtain significantly higher delivery rates of chemical vapors, e.g., flow rates of at least 2 g/s. As such, these systems can be used, for example, for high-throughput solder reflow using large-area substrates in large chambers. In some implementations, the systems described herein can advantageously operate without reliance on or use of a carrier gas. In some implementations, mass/flow control can be provided using pulsed volume injection control.

The systems described herein are also applicable to other manufacturing and fabrication processes, such as annealing in an atmosphere, etching, chemical vapor deposition, and atomic layer deposition. For example, the vaporized liquid can be tetramethylammonium hydroxide (TMAH) for use in atomic layer deposition of aluminum oxide. As another example, the vaporized liquid can be titanium chloride (TiCl4) for chemical vapor deposition of titanium nitride. As another example, the vaporized liquid can be tetrakis(ethylmethylamino)hafnium(IV) (TEMAH) for atomic layer deposition of hafnium oxide. As a further example, the systems described herein are well-suited for vaporization of silanes (e.g., Si—Cl, Si—OCH$_3$, Si—OCH$_2$CH$_3$, and the like), e.g., for use in deposition and coating processes. In some implementations, the vapor generated by the vaporizer 102 is an etchant for use in etch processes.

FIG. 1 illustrates an example of a material processing system 100 according to some implementations of the present disclosure. The system 100 includes a vessel 104 for holding a liquid, a vaporizer 102 for vaporizing the liquid to obtain a vapor, and a chamber 112 into which the vapor is provided for one or more processes. The vaporizer 102 is described in more detail with respect to FIGS. 2 through 6. The vessel 104, pressurizer 106, and valve 116 are described in more detail with respect to FIG. 7. In some implementations, a pressurizer 106 is included to pressurize the liquid in the vessel 104, to force the liquid into the vaporizer 102. A valve 116 can be controlled (e.g., by a controller 124) to control the flow of liquid from the vessel 104 into the vaporizer 102.

The controller 124 is configured to receive signals indicative of physical parameters of the material processing system 100 (e.g., pressure(s), temperature(s), and/or the like), and to send signals that control elements of the material processing system 100. For example, as discussed below, the controller 124 can send signals to heaters to set temperature(s) of the material processing system 100, to a regulator 704 (shown in FIG. 7) to set a push pressure of the pressurizer 106, and/or to the valve 116 to enable and disable liquid flow into the vaporizer 102. The controller 124 can include one or more computing systems local to and/or remote from other components of the material processing system 100.

Figure 9:
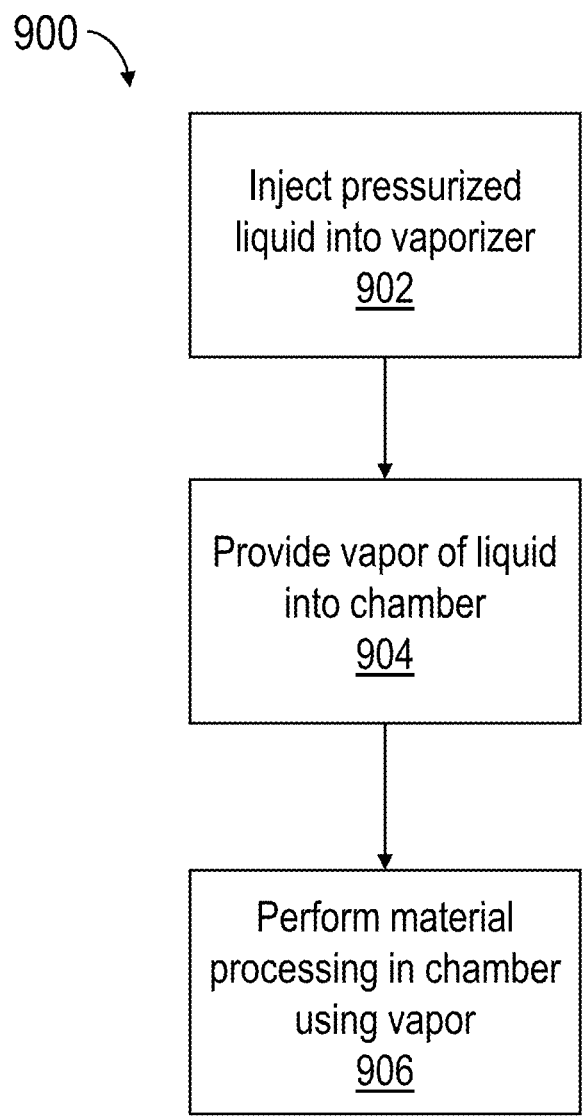
FIG. 9 is a diagram illustrating an example of material processing.

Further discussion of the material processing system 100 of FIG. 1, and processes performed using the material processing system 100, are provided with respect to FIG. 9.

Figure 2:
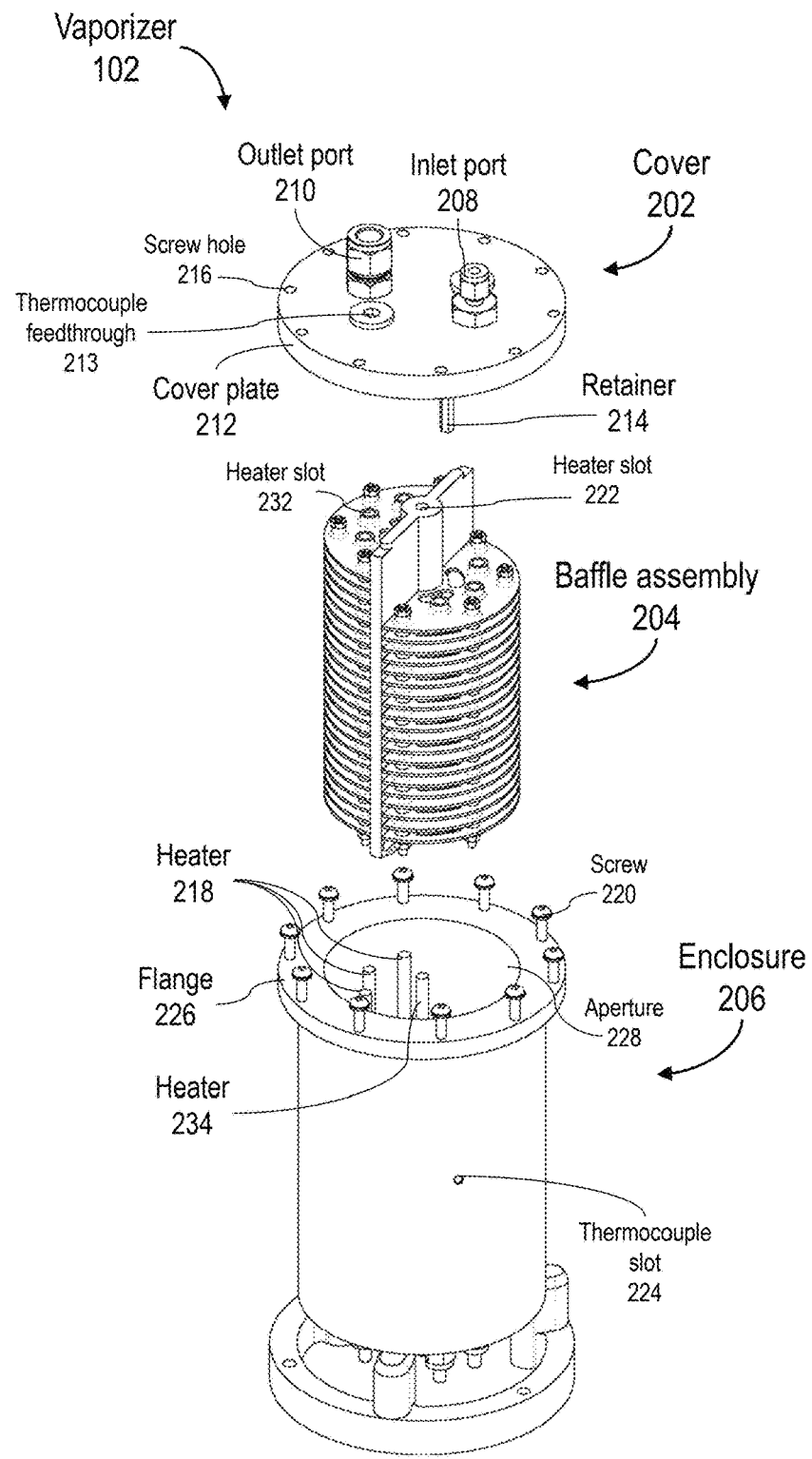
FIG. 2 is an exploded view of an example of a vaporizer.

FIG. 2 is an exploded view of an example of the vaporizer 102. In this example, the vaporizer 102 includes a cover 202, a baffle assembly 204, and an enclosure (alternatively referred to as a body) 206. The baffle assembly 204 fits into an aperture 228 in the enclosure 206 to be circumferentially surrounded by and enclosed in the enclosure 206, and a cover plate 212 of the cover 202 fits onto a flange 226 of enclosure 206 to substantially seal the aperture 228. Screws 220 extend through screw holes 216 in the cover plate 212 and into the flange 226 to hold the cover 202 and the enclosure 206 together. A retainer 214 (e.g., a vertical stop) extending downward from the cover plate 212 restricts movement of the baffle assembly 204, e.g., prevents the baffle assembly 204 from sliding if the vaporizer 102 is turned upside-down after assembly. A thermocouple feedthrough 213 permits the insertion of a thermocouple to measure the internal temperature of the vaporizer 102, e.g., while retaining a sealed environment for the vaporizer 102.

As described in greater detail with respect to FIGS. 3A-3B, the baffle assembly 204 includes a plurality of baffles, fins, or blades, which subsequently are referred to, without loss of generality, as plates 304 such as plates 304-1 and 304-2. These baffles, fins, blades, or plates can be configured in a stacked arrangement, positioned on top of one another with intervening spaces on the order of millimeters, or another spacing. Openings in the baffles, fins, blades, or plates define the tortuous path. For example, as discussed in further detail below, openings in adjacent baffles, fins, blades, or plates can be laterally offset with respect to one another, such that the tortuous path 108 includes repeated twists in order to pass through successive openings.

A thermocouple slot 224 formed in an outer surface of the enclosure 206 is configured to receive a thermocouple for measuring a temperature of the vaporizer 102. For example, the thermocouple slot 224 can receive an "over temperature thermocouple" which outputs temperature data used by a controller (e.g., controller 124) to determine whether the vaporizer 102 is exceeding a target or safe temperature range. One or more other temperature sensors of any suitable type (e.g., resistive and/or diode-based) can instead or additionally be included elsewhere in the vaporizer 102. For example, in some implementations, a thermocouple is included in a central heater slot 222 to measure and output a temperature of the vaporizer 102. In some implementations, an internal thermocouple of the vaporizer 102 is connected externally through the thermocouple feedthrough 213. The temperature sensor(s) (e.g., thermocouple(s)) can provide signals indicative of sensed temperatures to the controller 124, and the controller 124 can adjust the power of one or more heaters (such as cartridge heaters 218, 234, and/or 344) to cause the temperature to be within a target range, as discussed below.

The vaporizer 102 includes at least one heater for heating the vaporizer 102 (e.g., heating walls of a tortuous path in the vaporizer 102). As discussed below, the operation of the at least one heater can vaporize liquid injected into the vaporizer 102. In the example of FIG. 2, the vaporizer 102 includes six cartridge heaters extending longitudinally through an interior of the enclosure 206 and through corresponding heater slots in the baffle assembly 204. Each hemisphere (or section, or chamber) of the baffle assembly 204 (see the discussion of FIGS. 3A-3B for discussion of the hemispheres or sections) includes three heater slots 232 through which a corresponding cartridge heater 218 extends (for example, through multiple plates), and a central cartridge heater 234 extends through the central heater slot 222 in a center of the baffle assembly 204. The cartridge heaters 218, 234 can be controlled to heat the baffle assembly 204 to a target temperature. For example, in some implementations, the at least one heater of the vaporizer 102 is controlled (e.g., by the controller 124) to heat the vaporizer 102 to a temperature in a range from 90° C. to 220° C., e.g., in a range from 90° C. to 150° C., or in a range from 150° C. or 160° C. to 220° C., for example, in a range from 170° C. to 200° C. In some implementations, the temperature is controlled to be less than a maximum rating of o-ring seals of the vaporizer 102, e.g., 275° C. These ranges have been found to provide effective vaporization of chemicals such as formic acid and silanes. The cartridge heaters 218, 234 can be, for example, 250 W cartridge heaters.

Figure 3A:
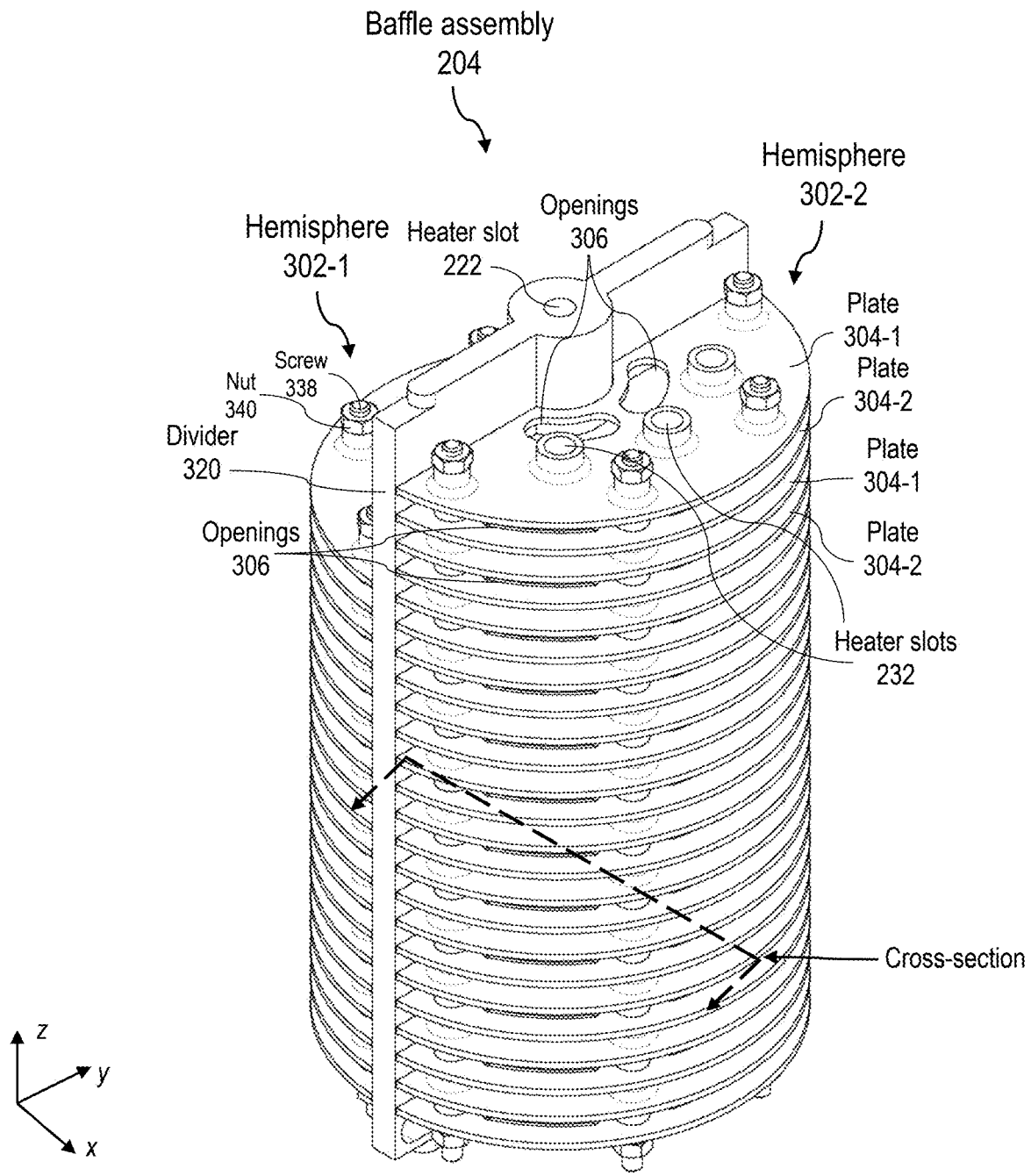
FIG. 3A is a perspective view of an example of a baffle assembly.

In some implementations, as shown in FIG. 3A, the heater slots 232 and holes for the screws 338 (labeled as screw holes 510 in FIGS. 5A-5B) include embossments projecting out from at least some of the plates 304. The embossments can cause increased mixing of fluid and/or increase the heat transfer surface, both of which can advantageously promote increased vaporization. In some implementations, embossments are provided on at least some of the plates 304 independent of the heater slots 232 and/or screw holes, e.g., one or more embossments (when included) can be separate from the heater slots 232 and/or screw holes.

In some implementations, the heaters, such as the cartridge heaters 218, 234, have, as an outer portion (e.g., a sheath), an iron-nickel-chromium alloy, which has been found to provide effective resistance to acidic or corrosive fluids. However, other materials for the heaters are also within the scope of this disclosure, based on material compatibility with the temperature(s) and liquid(s) with which the vaporizer 102 will be used. Further, the heaters are not limited to cartridge heaters, and any one or more suitable types of heater can be used.

In some implementations, further heater(s) are included in the enclosure 206. For example, multiple outer heaters 344, shown in FIGS. 3C-3D, can extend longitudinally through the enclosure 206 to surround the baffle assembly 204. In some implementations, as shown in FIG. 3B, the heaters 344 are inserted from the bottom side of the enclosure 206. Heater retaining screws 342 can extend longitudinally adjacent to the heaters 344 to hold the heaters 344 in position.

The cover 202 includes an inlet port 208 for liquid flow into the vaporizer 102 (e.g., to the baffle assembly 204 to enter the tortuous path), and an outlet port 210 for vapor flow out of the vaporizer 102. As shown in FIG. 1, the inlet port 208 can be fluidically coupled to the vessel 104 via a fluid line (e.g., through liquid line 134 and a valve 116) to receive the liquid. The outlet port 210 can be fluidically coupled to the chamber 112 via a vapor line 126 to provide the vapor to the chamber 112. The inlet port 208 and the outlet port 210 can include any fitting suitable for liquid and/or gas transfer, e.g., metal gasket face seal fittings.

It will be understood that the combination, division, and configuration of elements of the vaporizer 102 shown in FIG. 2 (e.g., the elements 202, 204, 206) are examples, and that other implementations are within the scope of this disclosure. For example, in some implementations, at least a portion of the cover 202 is integral with the baffle assembly 204 and/or the enclosure, and/or at least a portion of the baffle assembly 204 is integral with the cover 202 and/or the enclosure 206. For example, the plates of the baffle assembly 204 (discussed in further detail below) can be formed as integral protrusions from the enclosure 206. As another example, the baffle assembly 204 can include outer walls that define laterally-outer surfaces of the tortuous path (discussed below), e.g., rather than the outer surfaces being defined by inner walls of the enclosure 206 as in the example of FIG. 2.

As another example, other locations of the inlet port 208 and outlet port 210 are within the scope of this disclosure. For example, the inlet port 208 and the outlet port 210 can be on opposite longitudinal ends of the vaporizer 102 (as opposed to both being at a top side of the vaporizer 102 as in the example of FIG. 2), or at least one of the inlet port 208 or the outlet port 210 can be on a lateral side of the vaporizer 102. As another example, although the vaporizer 102 of FIG. 2 has a generally tall, narrow, and cylindrical shape, other shapes and proportions of the vaporizer 102 are also within the scope of this disclosure.

As another example, numbers, types, and locations of mechanical coupling elements (e.g., the screws 220) and the heater(s) (e.g., cartridge heaters 218, 234, 244) can be modified without departing from the scope of this disclosure. In some implementations, at least one heater is configured to heat specifically one or more uppermost plates (closest to the atomizer nozzle), and to not heat one or more plates further from the atomizer nozzle, to ensure that the uppermost plate(s) reach a desired operating temperature in view of the liquid provided thereon.

FIG. 3A is a perspective view of the baffle assembly 204. FIG. 3B is a cross-sectional view of the vaporizer 102. These drawings illustrate how the baffle assembly 204 forms a tortuous path for fluid flow to promote highly efficient liquid vaporization.

Figure 3B:
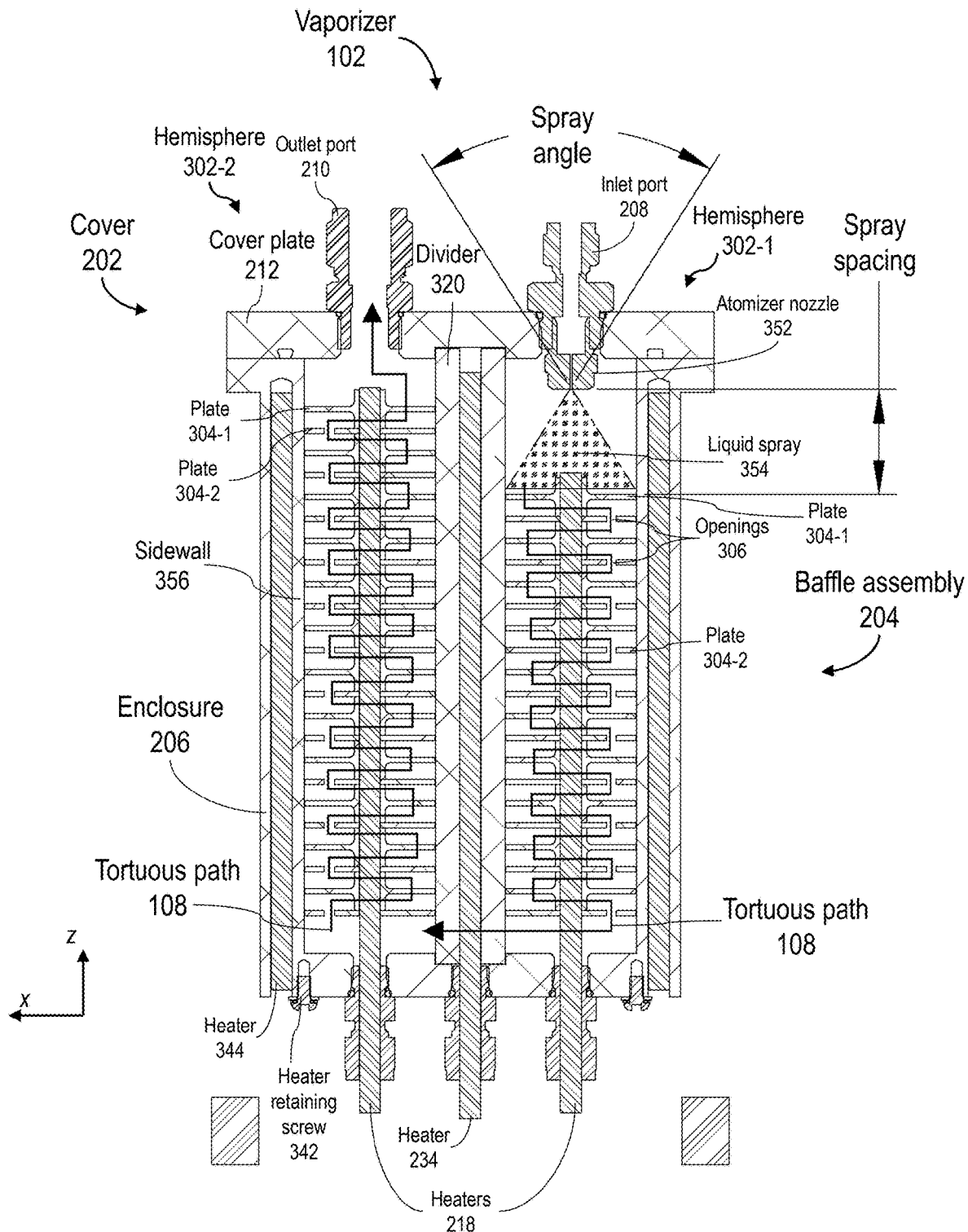
FIG. 3B is a cross-sectional view of an example of a vaporizer.

As shown in FIG. 3B, liquid from the inlet port 208 (e.g., liquid from the vessel 104) is injected, as a liquid spray 354, into an interior of the vaporizer 102 by an atomizer including, or consisting of, an atomizer nozzle 352. The liquid spray 354 includes many small droplets of the liquid, which are projected (in a pressurized injection based on pressure from the pressurizer 106) onto an opposing surface of a plate 304. The atomizer promotes vaporization of the liquid in at least two ways. First, the small droplets of the liquid spray 354 have a high surface area, which can make them more prone to vaporization, e.g., compared to a continuous portion of liquid. In some implementations, the atomizer is configured to output the liquid spray 354 with high number of smaller droplets. For example, the atomizer nozzle 352 can be a full-cone nozzle. Second, the liquid spray 354 can be projected such that it contacts a surface opposing the atomizer nozzle 352—in this example, a plate 304—over a relatively wide surface area. For example, the plate 304 (or other surface) opposing the atomizer nozzle 352 can be arranged at a distance from the atomizer nozzle 352 (a "spray spacing" as shown in FIG. 3B) that is equal to or close to a focal length of the spread of the liquid spray 354, e.g., within 10% or within 20% of the focal length. In some implementations, effective spread and vaporization of the injected liquid have been found to be achieved when the spray angle of the liquid spray 354 is in a range from 50° to 80° (e.g., in a range from 60° to 70°), and/or when the spray spacing is in a range from 2 mm to 4 mm (e.g., in a range from 2.5 mm to 3.5 mm).

In some implementations, as shown in FIGS. 3A-3B, an uppermost plate 304 in a stack of plates 304 that receives the liquid spray 354 (in hemisphere 302-1) is recessed compared to an uppermost plate 304 in another stack of plates 304 (e.g., in hemisphere 302-2). This positioning provides the spray spacing that permits distribution of the liquid spray 354 over a wide area. For example, the stack of plates in hemisphere 302-1 can have fewer plates than the stack of plates in hemisphere 302-2. The uppermost plate 304 can have a surface (e.g., its top surface) exposed to the atomizer nozzle 352. The use of the atomizer may reduce a concentrated cooling effect caused by liquid hitting the uppermost plate 304 or set of uppermost plates 304.

The uppermost plate 304 is a plate toward which the liquid spray 354 is directed and can define a first end of the tortuous path 108. A second end of the tortuous path 108 can be defined, for example, at a last plate 304 along the tortuous path 108 (in the example of FIGS. 3A-3B, an uppermost plate in the stack of plates 304 in hemisphere 302-2, closest to the outlet port 210).

In some implementations, effective dispersal of the liquid as small droplets is further aided by the pressure applied to the liquid by the pressurizer 106 that is included in some implementations.

As shown in FIGS. 3A-3B, the baffle assembly 204 includes a series of stacked plates 304 (alternatively referred to as baffles or fins) of two types, plates 304-1 and 304-2. As described below, the two types of plates 304 in combination (e.g., alternating) form a tortuous path based on different positions of holes on the two types of plates 304. Two stacks of plates 304, arrayed parallel to one another and spaced apart by a divider 320 (e.g., a wall or spacer) in which the central heater slot 222 is formed, are arranged in respective hemispheres (alternatively referred to as sections or zones) 302-1, 302-2 of the baffle assembly 204. In some implementations, the hemispheres 302-1, 302-2 are separate components that are attached to one another.

However, the scope of this disclosure is not limited to this arrangement of the plates 304. For example, in some implementations, only a single stack of plates 304 is present, or three or more stacks of plates are present. For example, in the case of a single stack of plates 304, fluid flow can be in a top-to-bottom direction with the inlet on the top and the outlet at the bottom, as opposed to the top-to-bottom-to-top flow discussed with respect to FIGS. 3A-3B. As another example, although the vaporizer 102 of FIGS. 3A-3B includes separate plates 304 in the different hemispheres 302-1, 302-2, the plates 304 can alternatively be configured to be arranged in both hemispheres 302-1, 302-2. Moreover, the baffle assembly 204 need not be divided into hemispheres or other analogous sections. Further, in some implementations, the baffle assembly 204 is divided into more than two sections. For example, the baffle assembly 204 can be divided into four quadrants with dividers between any or all adjacent pairs of the quadrants.

In some implementations, stacks of plates 304 arranged in different hemispheres have different numbers of plates, have different dimensions from one another (e.g., different vertical/longitudinal dimensions, such as height), and/or are vertically offset with respect to one another. For example, different numbers of plates and/or different heights of stacks may facilitate a target spray spacing.

The plates 304 are stacked in the longitudinal direction, and the plate types alternate in the stack, such that the plates 304 include a plate 304-1, a plate 304-2, a plate 304-1, a plate 304-2, etc., in a direction of the stack. The stack direction, or longitudinal direction, extends along the z-direction in the coordinate axes shown in FIGS. 3A-3D. The z-direction is perpendicular to two lateral directions x and y, which are also perpendicular to one another. Within each stack, the plates 304 extend parallel to one another, having broadest surfaces in the x-y plane. Further, the plates 304 in the two stacks also extend parallel to one another. Sets of screws 338 (or rods or bolts) extend longitudinally through each hemisphere 302-1, 302-2 (e.g., through screw holes 510 labeled in FIGS. 5A-5B), and nuts 340 corresponding to each plate 304 mate with the screws 338 to hold the plates 304 of each hemisphere 301-1, 302-2 together. In some implementations, the use of the discrete plates 304 (e.g., joined by the screws 338) is advantageous for manufacture, as it permits the separate and relatively simple manufacture of each plate 304 separately before the plates 304 are joined together to form the baffle assembly 204. Further, plates 304 can be replaced (e.g., in the case of damage) relatively easily. However, the plates 304 need not be separate components from one another; in some implementations, at least some of the plates 304 are integral with one another.

In some implementations, at least some of the plates 304 (e.g., adjacent plates within a stack) are inclined relative to one another and/or with respect to the stack direction (longitudinal direction). For example, a first plate may be horizontal while a second plate is tilted, or both plates may be tilted with respect to the stack direction (e.g., where non-tilted plates are oriented orthogonal to the stack direction). In some implementations, inclined plates promote liquid flow (e.g., downward liquid flow) and/or vapor flow (e.g., upward vapor flow), thereby providing improved fluid flow, vaporization efficiency, and/or overall vapor delivery.

The plates 304 are configured to form and define the tortuous path 108 for flow of the liquid and vapor. The injected liquid (e.g., of the liquid spray 354) vaporizes and expands, resulting in an increase in pressure that is converted into a flow velocity of the liquid and vapor through the tortuous path 108. In some implementations, fluid flow through the tortuous path 108 is primarily or entirely caused by vapor expansion, except for any small contribution provided by the initial velocity of the injected liquid. As the liquid and vapor are driven through, or pass through, the tortuous path 108, the fluid absorbs energy (heat) from the heated plates 304, such that the liquid is caused to vaporize and the vapor remains in the vapor state (e.g., with little or no condensation). In some implementations, as shown in FIG. 3B, the tortuous path 108 is further defined by inner sidewalls 356 of the enclosure 206 in which the baffle assembly 204 is arranged.

The plates 304 have respective openings 306 (or holes, or cutouts) with positions that increase the length of the tortuous path 108. For example, a pair of adjacent plates 304 can have respective openings 306 that have different positions relative to an overall flow path (e.g., top-to-bottom or bottom-to-top) of the fluid, such that the fluid is forced through multiple twists, bends, and/or doubling-back paths to travel through the openings 306. For example, in some implementations, a pair of adjacent plates 304 have respective openings 306 that are at different distances from a longitudinal axis of the vaporizer 102, such as a central longitudinal axis of the vaporizer 102 (e.g., an axis extending through the central heater slot 222). In some implementations, a pair of adjacent plates 304, spaced apart in the z direction, have respective openings 306 that have different x/y coordinates. In some implementations, the openings 306 in a pair of adjacent plates 304 are at entirely different lateral positions. In some implementations, a pair of adjacent plates 304 have at least one opening 306 at a common lateral position, and at least one of the adjacent plates 304 has at least one opening 306 at a lateral position different from lateral positions of any of the openings 306 of the other of the adjacent plates 304.

Figure 5A:
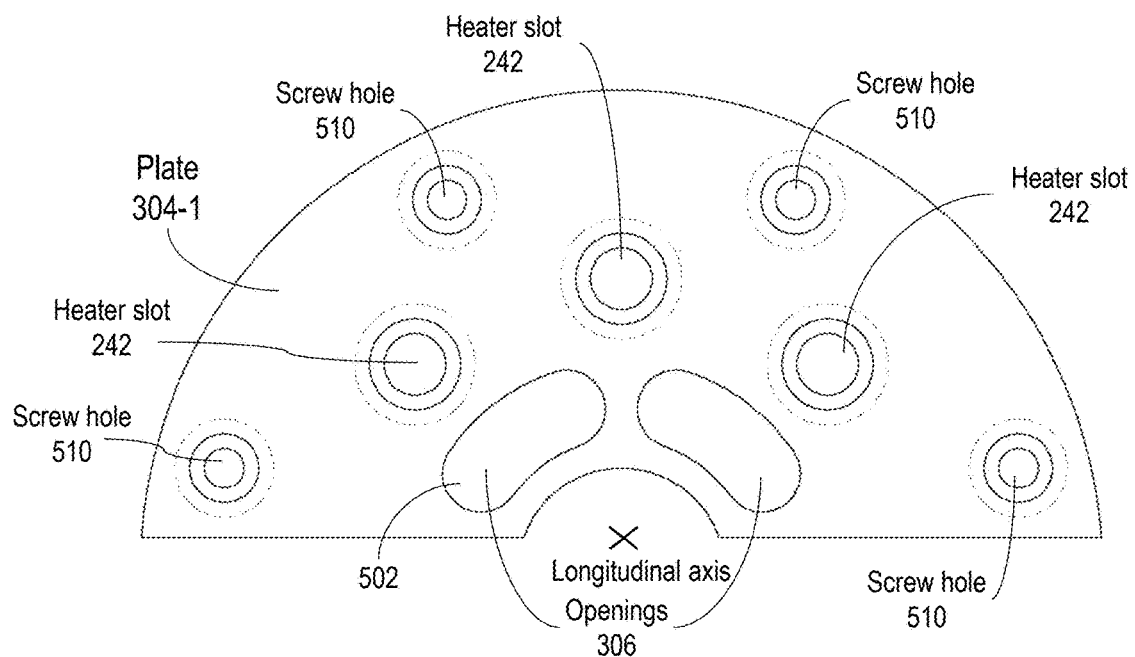
FIGS. 5A-5B are top views of examples of plates of a baffle assembly.
Figure 5B:
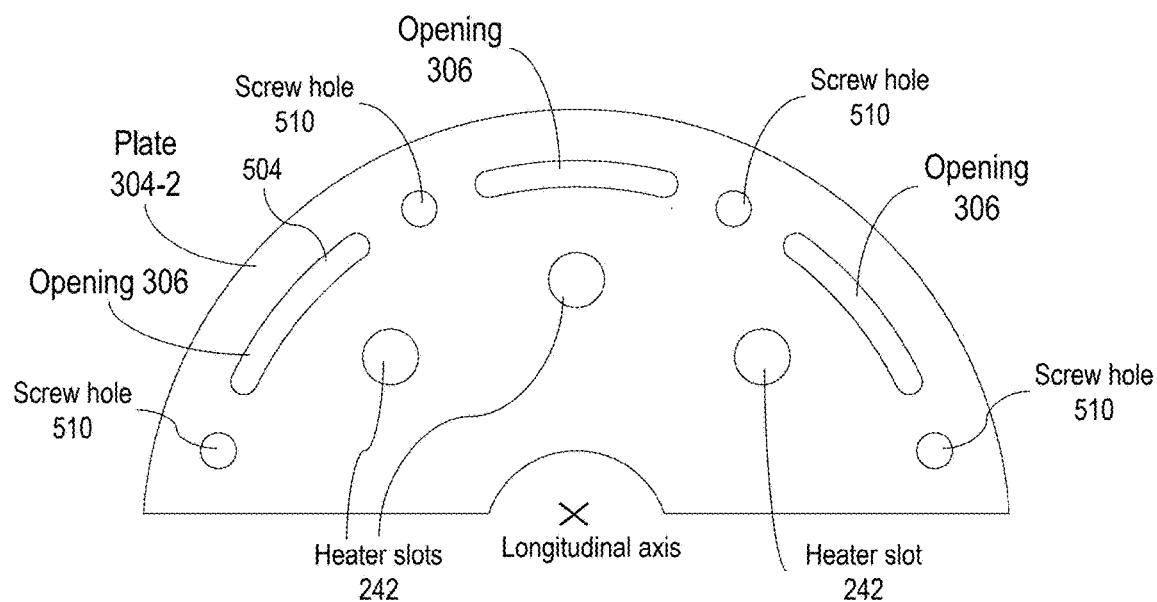

In some implementations, as shown for the vaporizer 102 in FIGS. 3A-3B, the openings 306 alternate between inner positions (closer to the central axis of the vaporizer 102, or radially inward) in plates 304-1, and outer positions (farther from the central axis, or closer to the lateral outer wall of the vaporizer 102, or radially outward) in plates 304-2. Each plate 304-1 has two inner openings 306 (visible in FIG. 3A), and each plate 304-2 has three outer openings (of which one is visible in FIGS. 3A-3B and all are shown diagrammatically in FIG. 3C). The plates 304-1, 304-2 are shown in a top view in FIGS. 5A and 5B, respectively. The longitudinal axis labeled in FIGS. 5A and 5B corresponds to the central longitudinal axis along which the central heater slot 222 extends. In some implementations, as shown in FIGS. 5A-5B, the plates 304-1, 304-2 of the two types have the same outer dimensions and the same locations of heater slots 242.

In the illustrated examples, the baffles or plates are shown as having substantially semicircular shapes. However, other shapes are also within the scope of this disclosure.

The plates 304-1, 304-2 alternate with one another in each hemisphere 302-1, 302-2. As such, the tortuous path 108 repeatedly switches from the radially-outward direction (−x direction) to the radially-inward direction (+x direction) in a sequence of connected chambers defined between adjacent pairs of plates 304. This configuration contributes to a long tortuous path 108 that is defined in a volume with high surface area. For example, liquid and vapor in the vaporizer 102 cannot simply travel in the vertical −z direction and then in the +z direction to go from the inlet port 208 to the outlet port 210 but, rather, are forced to travel with a long lateral path length in x-y planes, increasing the overall path length and the surface area of the tortuous path 108.

In addition to or instead of these switches in lateral direction, in some implementations, the tortuous path 108 includes at least one switch in a vertical or longitudinal direction. As shown in FIG. 3B, the tortuous path 108 first has an overall downward direction (−z direction) in hemisphere 302-1. The tortuous path 108 then continuous into hemisphere 302-2 (e.g., through an opening 360 as shown in FIG. 3D), where the tortuous path 108 has an overall upward direction (+z direction) to reach the outlet port 210.

The tortuous path 108 promotes a high vaporization efficiency such that most, all, or substantially all of the injected liquid is converted into vapor, even for relatively high in-flow rates of the liquid. For example, the tortuous path 108 can provide a long fluid flow path relative to the overall dimensions of the vaporizer 102, increasing vaporization efficiency as the liquid has more time/distance to be vaporized and permitting compact design of the vaporizer 102.

Further, the tortuous path 108 has a high surface area, corresponding to a thinner layer of the injected liquid distributed across surfaces of the plates 304 and enclosure 206 that define the tortuous path 108. The thinner layer corresponds to increased vaporization of the liquid.

For example, in some implementations, the baffle assembly 204 is configured such that the tortuous path switches from a first direction to a second direction opposite the first direction (e.g., from radially outward in order to pass through an opening 306 in a plate 304-2, to radially inward in order to pass through an opening 306 in a plate 304-1) at least ten times, at least twenty times, at least thirty times, or at least forty times, as shown in FIG. 3B. In some implementations, the baffle assembly 204 is configured such that an overall direction of the tortuous path, neglecting changes in direction associated with individual plates 304, switches direction at least once, e.g., from the −z direction in hemisphere 302-1 to the +z direction in hemisphere 302-2 as shown in FIG. 3B. In some implementations, the baffle assembly 204 is configured such that, when the tortuous path 108 is defined in a volume having an overall dimension D along a direction, the tortuous path 108 has a length at least 3D, at least 4D, or at least 5D along the same direction. For example, the baffle assembly 204 can have an inner diameter (between opposite sidewalls 356 of the enclosure 206) of about 100 mm (which determines a volume for the tortuous path having an overall dimension of 100 mm along the x-axis), and the tortuous path 108 can have a total path length along the radial direction (e.g., −x and +x path segments, or rightward and leftward path segments in FIG. 3B, or radially-inward and radially-outward segments) of at least 500 mm. In some implementations, a distance between adjacent plates 304 in the stack direction (e.g., the z direction of FIGS. 3A-3B) is less than 20 mm or less than 10 mm, e.g., in a range from 3 mm to 7 mm. The spacing between adjacent plates corresponds to a dimension of an intervening space between the vertically-stacked plates 304. These distances have been found to provide an effective balance between providing a high surface area and long tortuous path 108 (corresponding to a shorter distance), and maintaining a flow resistance that is not excessive (corresponding to a longer distance). In some implementations, a thickness of the plates 304 (e.g., in the stack or z direction) is less than 3 mm, less than 2 mm, or less than 1.5 mm. In some implementations, a lateral distance (e.g., closest distance projected in an x-y plane) between laterally-closest openings 306 in a pair of adjacent plates 304 (e.g., a lateral distance between opening 502 and opening 504 in FIGS. 5A-5B) is at least 10 mm, at least 15 mm, or at least 20 mm. In some implementations, one or more of these characteristics have been found to provide efficient vaporization, e.g., with little or no fluid being un-vaporized when output at the outlet port 210, even for relatively high liquid throughput in the absence of a carrier gas. This characteristic can be desirable, because liquid provided into the chamber 112 generally does not perform a useful function and represents a decrease in the amount of vapor provided into the chamber 112 for a given amount of liquid provided into the vaporizer 102.

It will be understood that modifications to the plates 304-1, 304-2, the shapes and positions of the openings 306, and the configuration of the baffle assembly 204 to form a long tortuous path 108, are within the scope of this disclosure. For example, the plates 304 need not be provided in two types that alternate; rather, in some implementations, different types of plates 304 are arranged in a non-alternating manner, and/or three or more types of plates can be present (e.g., plates 304 of three types arranged in a pattern of type 1/type 2/type 3/type 1/type 2/type 3, etc.). As another example, although the openings 306 are shown to generally be arranged radially inward and radially outward in the two types of plates 304-1, 304-2, the openings 306 can instead or additionally be otherwise arranged to provide a long path length; for example, the openings 306 can be arranged at opposite edges of the plates 304 along the y-axis, without necessarily having different radial positions (though the radial positions can additionally or instead differ, as shown in FIGS. 3A-3B).

The illustrated configuration of the plates 304 is an example of a configuration of the tortuous path 108 based on sets of openings. For two plates 304-1, 304-2 that are successive along the tortuous path 108, each plate 304-1, 304-2 includes a set of one or more openings 306. The one or more openings 306 of each set (e.g., of each plate 304-1, 304-2) are arranged at a common level along the longitudinal direction (z-axis). For example, the one or more openings 306 can have the same z-coordinate and different x and y coordinates. Further, the one or more openings 306 in a first set (e.g., of plate 304-1) are arranged at a different level, along the longitudinal axis, than the one or more openings 306 in a second set (e.g., of plate 304-2). For example, the sets can be arranged at different z-coordinates. Further, the one or more openings 306 of the first set (e.g., of plate 304-1) are at different lateral positions (e.g., entirely different lateral positions) from the one or more openings of the second set (e.g., of plate 304-2). It will be apparent that this configuration of openings to define the tortuous path is not reliant on the presence of "plates" but, rather, can be provided using a variety of suitable structures, such as additively-manufactured structures, machined structures, and molded structures.

Figure 3C:
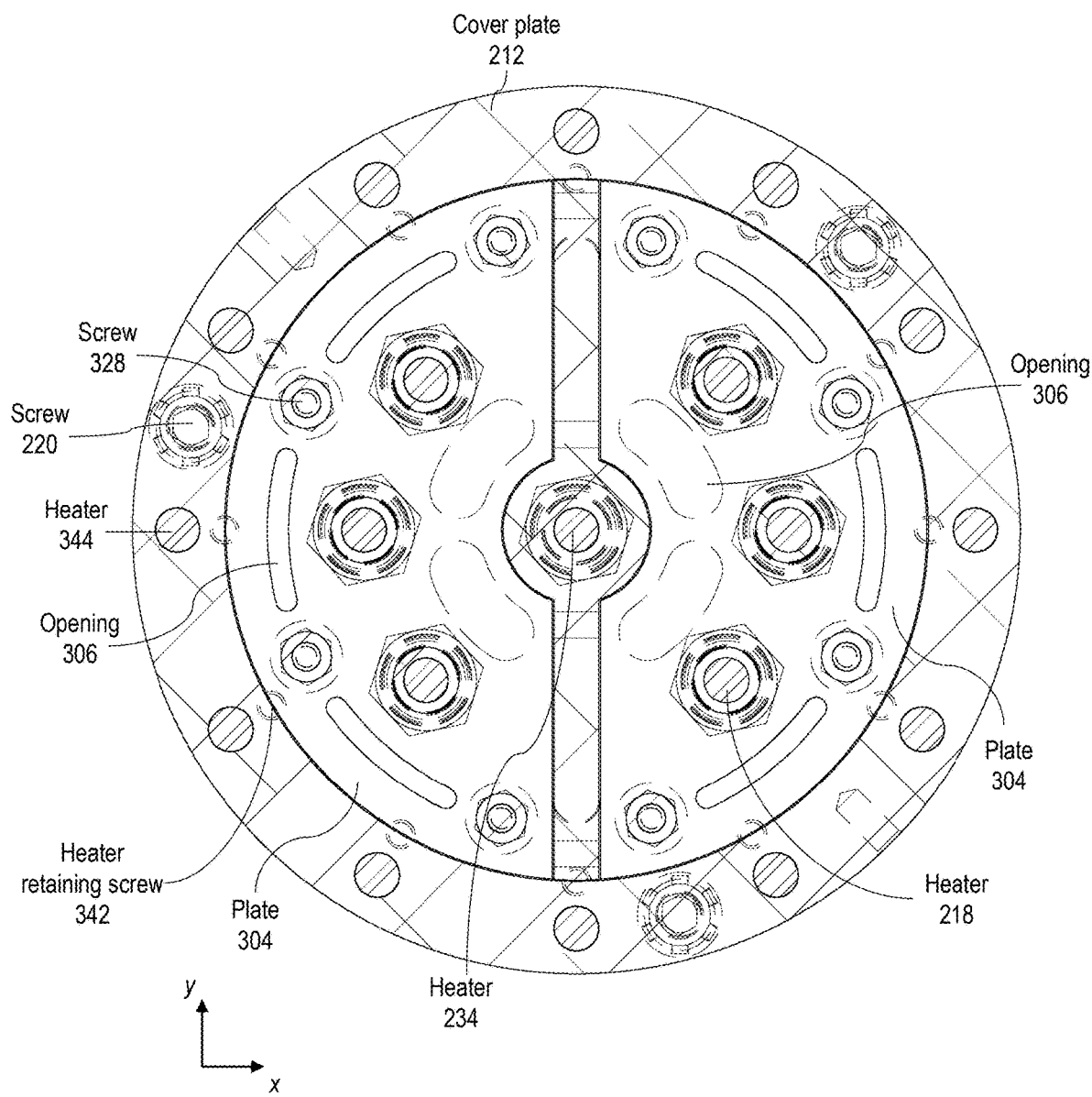
FIG. 3C is a diagrammatic top view of an example of a vaporizer.
Figure 3D:
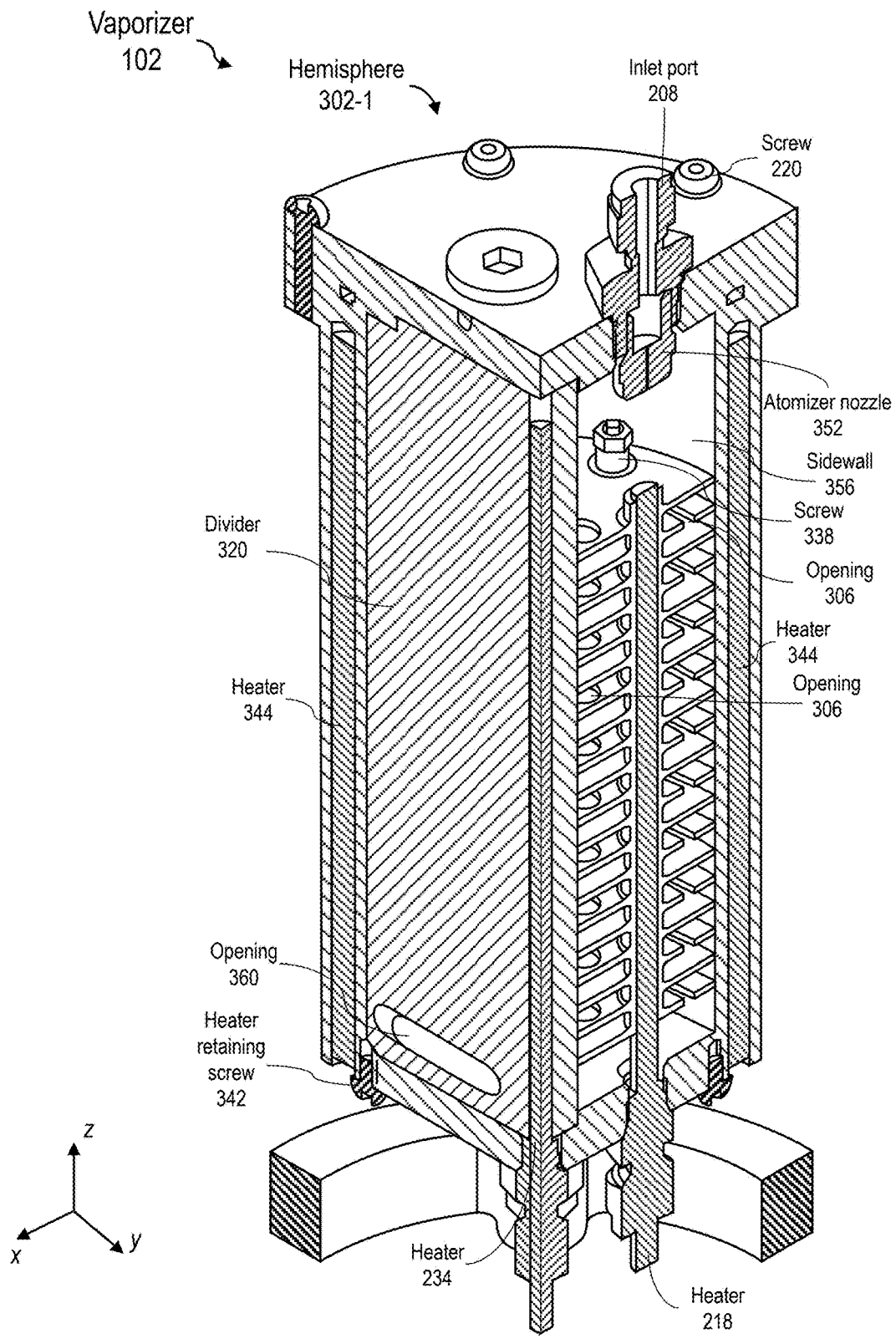
FIG. 3D is a sectional view of an example of a vaporizer.

FIG. 3C is a diagrammatic top view of the cover 202, baffle assembly 204, and enclosure 206, showing a selection of elements (some of which are internal) and their positions in multiple x-y planes. Heaters 344 are arranged circumferentially around plates 304, extending longitudinally through the enclosure 206. Openings 306 in both types of plates 304-1, 304-2 are illustrated. FIG. 3C shows an example in which the plates 304-2 have three outer openings 306, as opposed to four outer openings 306 in the example of FIG. 5B.

FIG. 3D is a sectional view illustrating a quarter of the baffle assembly 204, or half of hemisphere 302-1. The divider 320 includes an opening 360 through which the tortuous path 108 extends from hemisphere 302-1 into hemisphere 302-2. The divider 320 can partially define the tortuous path 108, e.g., define a y-z plane that delimits the tortuous path 108 in the hemisphere 302-1, as shown in FIG. 3D. In some implementations, the divider 320 includes two openings 360, e.g., the opening 360 shown in FIG. 3D and a second opening at the mirrored position along the y-axis (mirrored across the z-axis).

In some implementations, a configuration of the baffle assembly to have at least two overall chambers (e.g., the hemispheres 302-1, 302-2 described with respect to FIGS. 3A-3D) can be advantageous. In the first hemisphere 302-1 into which the liquid is provided, there is a first overall flow direction, e.g., downward. Given a vertical orientation of the baffle assembly 204, liquid provided into the first hemisphere 302-1 can fall downward with a continuous "waterfall flow" between openings 306 in the plates 304. In the second hemisphere 302-2, evaporated vapor rises upward between plates 304, sustaining the vapor, reducing condensation, and re-evaporating any micro-droplets that may not have fully evaporated in the first hemisphere 302-1. These effects can be provided, for example, when the vaporizer is configured to provide two overall flow directions that are opposite to one another or substantially opposite to one another (corresponding to both downward and upward overall flow, for example), but can also be provided by other characteristics of the vaporizers described herein.

Figure 4:
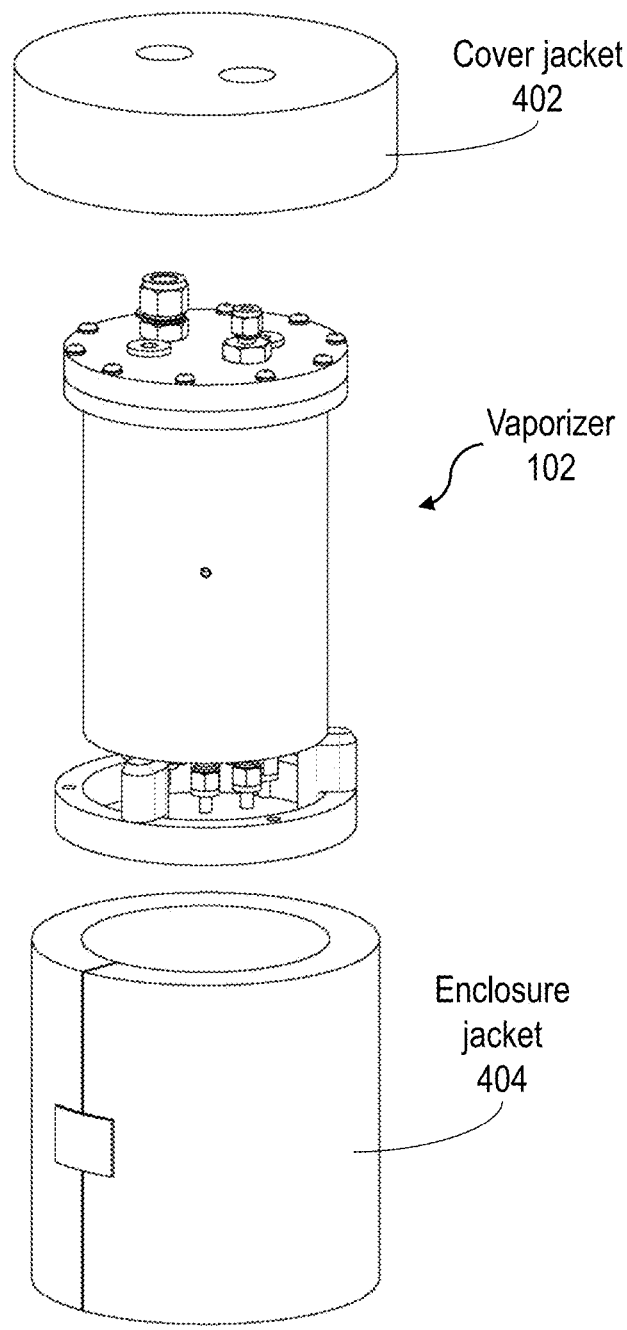
FIG. 4 is an exploded view of examples of insulating jackets.

The heaters illustrated in FIGS. 3A-3D are configured to maintain the surfaces defining the tortuous path 108 within a target temperature range, e.g., sufficiently high to cause vaporization and prevent condensation. In some implementations, one or more insulating jackets are included to thermally isolate the vaporizer 102 and facilitate its heating. For example, as shown in FIG. 4, a cover jacket 402 is configured to fit over the cover 202, and an enclosure jacket 404 is configured to fit around the enclosure 206.

Figure 6:
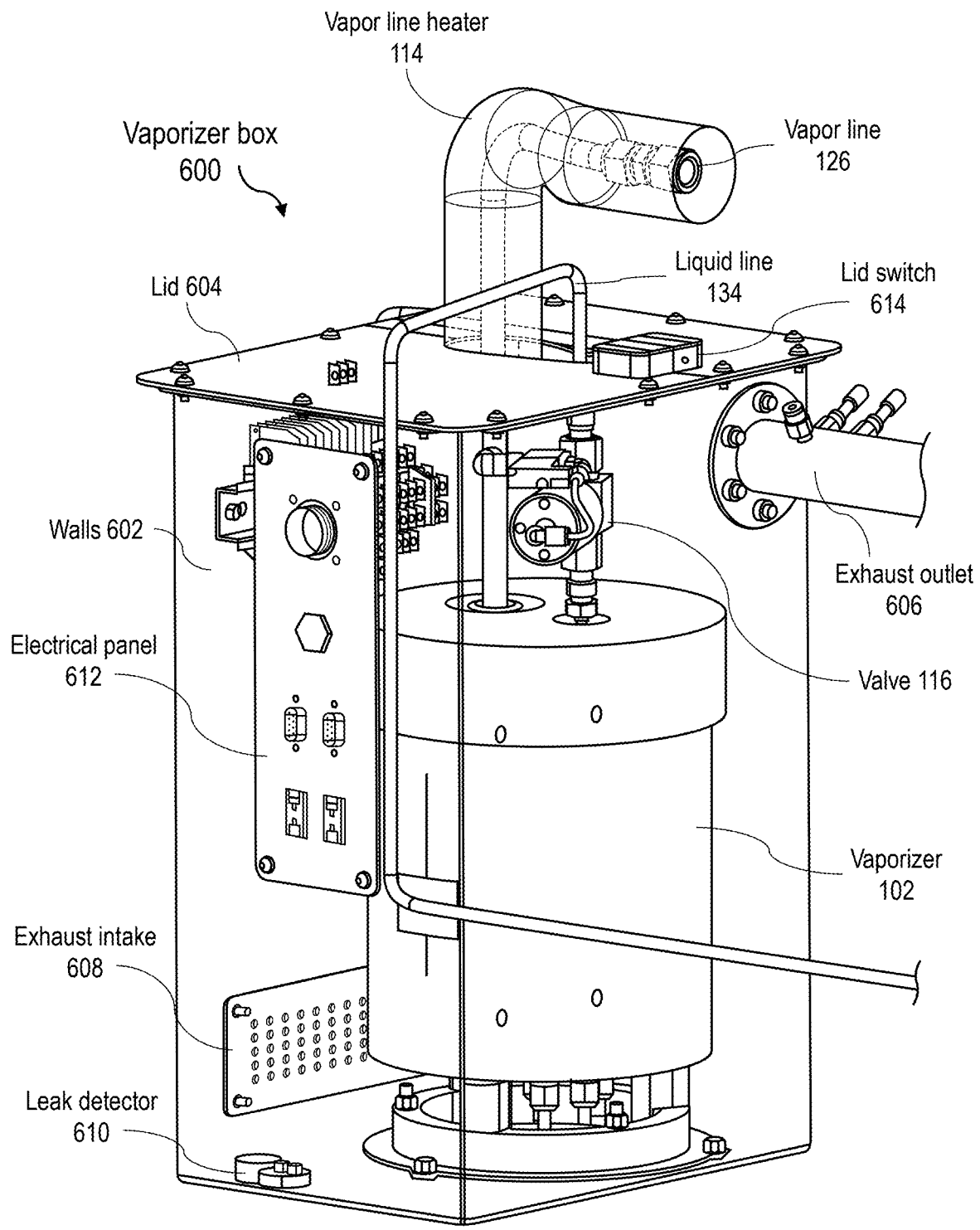
FIG. 6 is a perspective view of an example of a vaporizer box.

FIG. 6 illustrates an example of a vaporizer box 600 in which the vaporizer 102 (shown with jackets 402, 404) can be integrated, for example, in the material processing system 100. The vaporizer box 600 is configured to facilitate liquid delivery to the vaporizer 102 and vapor delivery from the vaporizer 102 to the chamber 112, while maintaining safety in view of the potentially toxic chemicals handled by the vaporizer 102. As shown in FIG. 6, the vaporizer box 600 includes barriers or walls 602, which in some implementations are at least partially transparent to facilitate monitoring inside the vaporizer box 600. Liquid line 134 enters the vaporizer box 600 through an opening in a lid 604 and provides liquid to valve 116, which can be controlled to provide liquid to the vaporizer 102. Vapor line 126 exits the vaporizer box 600 through the opening or another opening. In some implementations, vapor line 126 is at least partially surrounded by vapor line heater 114 (e.g., a heating jacket), which can be configured to maintain the vapor line 126 at a temperature that prevents condensation of the vapor inside the vapor line 126, e.g., a temperature in a range from 100° C. to 150° C., such as in a range from 120° C. to 140° C.

A box exhaust outlet 606 is connected to a pump that can continuously remove gas from the vaporizer box 600, to ensure safety in case of a leak from the vaporizer 102. An air exhaust intake 608 permits air to flow into the vaporizer box 600 as a result of the exhaust pumping. In some implementations, a leak detector 610 in the vaporizer box 600 is configured to sense a presence of a leak. For example, the leak detector 610 can include a gas sensor configured to detect the level or presence of the vapor produced by the vaporizer 102 (e.g., formic acid vapor, or a vaporous atomic layer deposition or chemical vapor deposition gas), and to output a signal indicative of the level or presence to a controller, e.g., controller 124. In the event of gas detection, or gas levels above a threshold value, the controller can shut down the system, e.g., turn off the valve 116 to prevent production of more vapor. In some implementations, a lid switch 614 is configured to sense whether the lid is open or closed. For example, the lid switch 614 can provide a signal to the controller or an interlock device, and the controller or interlock device can permit liquid flow to the vaporizer 102 only when the lid 604 is closed, for safety, e.g., by controlling the valve 116. An electrical panel 612 is configured to provide signal and power inputs/outputs to components in the vaporizer box 600, e.g., sensor signals, heater control signals, heater power signals, and/or valve control signals.

Figure 7:
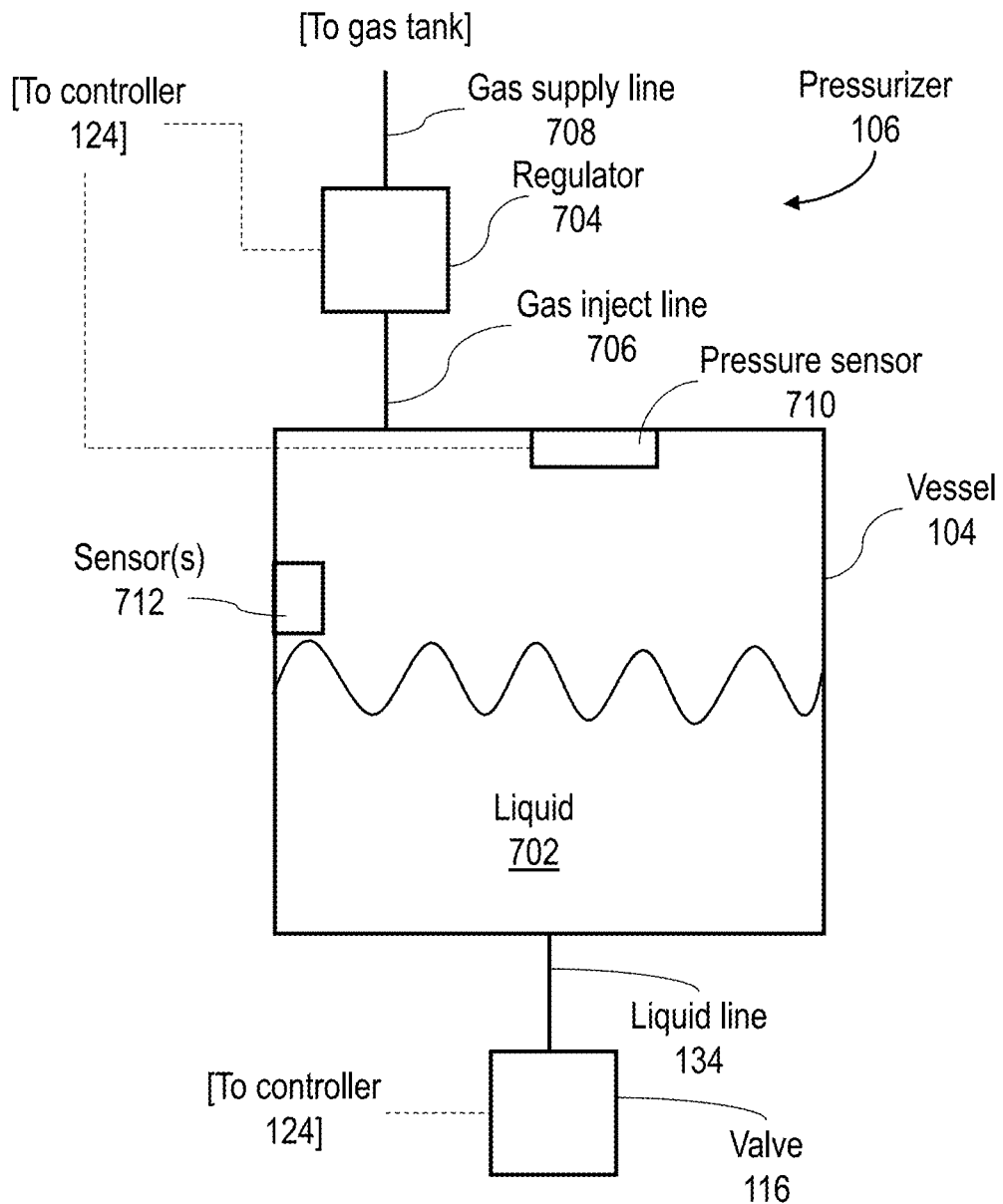
FIG. 7 is a diagram illustrating an example of a pressurizer.

FIG. 7 illustrates examples of the vessel 104 and the pressurizer 106. In some implementations, the vessel 104 includes one or more sensors 712, e.g., a leak sensor and/or a level sensor. The pressurizer 106 includes a regulator 704 (e.g., an adjustable regulator) connected between a gas inject line 706 (fluidically coupling the regulator 704 to the vessel 104) and a gas supply line 706 (fluidically coupling the regulator 704 to a gas tank). Gas from the gas tank is injected into the vessel 104 at a pressure set by the regulator 704 (e.g., an adjustable pressure controlled by signals provided by the controller 124), to pressurize liquid 702 in the vessel 104 and push the liquid 702 into the vaporizer 102 (e.g., through the valve 116). In some implementations, the gas is an inert gas such as nitrogen ($N_2$) or argon (Ar). In some implementations, the gas inject line 706 is arranged such that the gas is injected into a space above the liquid 702. For example, a port of the vessel 104 for coupling to the gas inject line 706 can be arranged at a top of the vessel 104 or otherwise above a surface level of the liquid 702. As such, the gas can provide pressure without itself being provided into the vaporizer 102. In some implementations, the liquid line 134 is arranged such that the liquid 702 is above the liquid line 134, so as to be pushed down into the liquid line 134. For example, a port of the vessel 104 for coupling to the liquid line 134 can be at a bottom of the vessel 104 or otherwise below a lowest level of the liquid 702.

In some implementations, the "push pressure" of the injected gas is in a range from 35 psi to 90 psi, such as a range from 20 psi or 40 psi to 60 psi. These pressures have been found to provide consistent delivery of the liquid 702 to the vaporizer 102. The push pressure can be greater than atmospheric pressure. In some implementations, the pressurizer 106 includes a pressure sensor 710 (e.g., in the vessel 104, in a fluid line connected to the vessel 104, or integrated with the regulator 704) configured to detect the push pressure. In some implementations, the pressure sensor provides an output signal, indicative of the sensed pressure, to a controller (e.g., controller 124), and the controller can control the regulator 704 to set the push pressure to a target value or to be within a target range. This control can provide precise control of the push pressure, which in some implementations can facilitate precise liquid delivery (corresponding to precise vapor delivery to the chamber 112).

The valve 116 can be any suitable valve for regulating liquid flow to the vaporizer 102. In some implementations, the valve 116 is a fast-acting valve, e.g., with a controllable on-time. In some implementations, the valve 116 can be controlled (e.g., by the controller 124) to pulse with an adjustable on-time for each pulse, to provide pulsed volume injection control. Additional details on control of the valve 116 are provided below with respect to FIG. 8.

For purposes of this disclosure, it has been determined that the pressurized provision of liquid can provide high and precisely-controlled levels of liquid injection into the vaporizer 102. This liquid injection can correspond to high rates of vapor delivery to the chamber 112. Further, in some implementations, the pressurizer 106 acts in conjunction with the atomizer 110 to generate the liquid spray 354 that facilitates high vaporization efficiency.

In some implementations, the vaporizer 102 can be used and/or is configured to deliver vapor with little or no carrier gas. For example, gas output from the vaporizer 102 can be at least 75%, at least 90%, at least 90%, at least 95%, or at least 99% composed of vapor of the liquid provided into the vaporizer 102. In some implementations, the vapor output from the vaporizer 102 is substantially entirely composed of the vapor of the liquid. In some implementations, the vaporizer 102 includes only a single fluid inlet (e.g., the inlet port 208 for liquid), and/or is configured or operated such that only the single fluid inlet is used. As such, vapor dilution can be reduced or eliminated, and the vapor can be delivered more effectively, e.g., with a higher partial pressure of the vaporized liquid.

Figure 8:
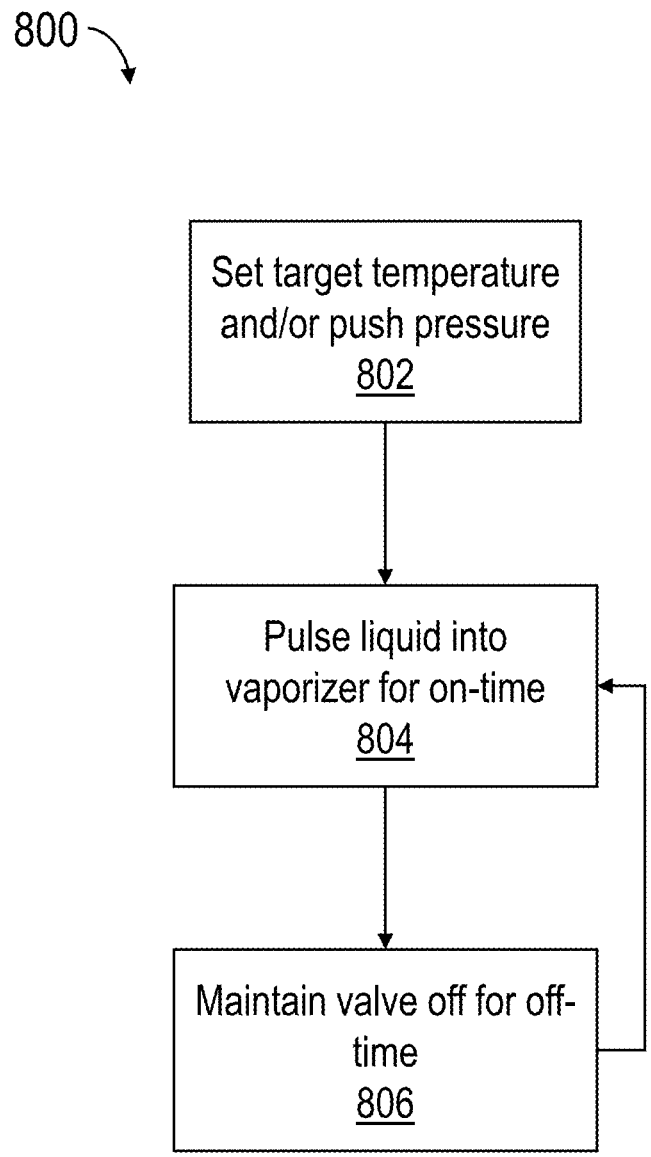
FIG. 8 is a diagram illustrating an example of a liquid injection process.

FIG. 8 illustrates an example of a process 800 for vapor delivery. The process 800 can be performed, for example, by the controller 124. The process 800 includes setting a target vaporizer temperature and/or a target push pressure (802). For example, the controller 124 can send signals to one or more of the cartridge heaters 218, 234, 344 to set an internal temperature of the vaporizer 102, e.g., to be in a range from 160° C. to 220° C. The controller 124 can send the signals based on temperature signals from one or more temperature sensors in the vaporizer 102, e.g., a thermocouple disposed in the central heater slot 222. The controller 124 can send a signal to the regulator 704 to set the push pressure, e.g., to be in a range from 35 psi to 90 psi, in some implementations based on a pressure sensed by the pressure sensor 710.

The process 800 includes, when the temperature and/or pressure are within target range(s), pulsing liquid into the vaporizer for an on-time (804). For example, the controller 124 can send a signal to the valve 116 to cause the valve 116 to pulse open. In some implementations, the on-time is in a range from 20 ms to 250 ms. In some implementations, the on-time is in a range from 40 ms to 250 ms, in a range from 40 ms to 150 ms, or in a range from 40 ms to 100 ms, time ranges which have been found to provide target delivery rates and target pressure increases in the chamber 112. For example, pulses from 40 ms to 250 ms, in conjunction with the vaporizers 102 described herein, have been found to consume liquid at a rate between 1.6 g/pulse and 2.3 g/pulse, a rate compatible with pressure requirements for the chamber 112.

After the pulsed delivery, the valve is maintained off for an off-time (806). For example, the controller 124 can pause after causing the prior pulse (804), before sending the next pulse, for the off-time. In some implementations, it has been found that the off-time is an important configurable parameters. The off-time allows liquid pressure to build back up behind the valve 116. However, longer off-times may result in slower vapor delivery rates, because pulses of liquid are delivered to the vaporizer 102 at a slower rate. In some implementations, the off-time is at least three times the on-time, at least five times the on-time, at least ten times the on-time, at least twenty times the on-time, or at least forty times the on-time. In some implementations, the off-time is in a range from 0.5 seconds to 4.0 seconds. These off-times have been found to result in target push-pressure recovery and target vapor delivery rates.

Operations 804 and 806 can be repeated, for example, a predetermined number of times, until the chamber 112 reaches a target pressure, or until a process in the chamber 112 is completed. During repetition of operations 804 and 806, in some implementations, the temperature and/or pressure are monitored, and the controller 124 may provide control signals responsive to measured temperature and/or pressure to cause the temperature and/or pressure to be within their target range(s).

FIG. 9 illustrates an example of a process 900 that can be performed using the vaporizers described herein, e.g., using the materials processing system 100. The process 900 is described using the example of a solder reflow process using formic acid. However, it will be understood that the systems described herein are equally applicable to other chemical vaporizers and/or processes. For example, in some implementations, the vapor generated by the vaporizer 102 is an etchant, for use in etch processes. In some implementations, the vapor generated by the vaporizer 102 is a chemical vapor deposition or atomic layer deposition precursor, for use in deposition processes. Further, the characteristics of the materials processing system 100 described in conjunction with process 900 are not dependent on the process 900 but, rather, can be included in the materials processing system 100 independent of process(es) performed using that system.

As shown in FIG. 9, the process 900 includes injecting a pressurized liquid into a vaporizer, such as vaporizer 102 (902). For example, the liquid can be formic acid. The liquid can be pressurized using a pressurizer 106 as discussed in reference to FIG. 7. Referring to FIG. 1, the liquid can be injected from the vessel into the vaporizer 102 through liquid line 134 and valve 116. In some implementations, the liquid is injected into the vaporizer 102 through an such as atomizer 110, e.g., to form a liquid spray in the vaporizer 102 to promote vaporization. In some implementations, the vaporizer includes a tortuous path, such as tortuous path 108, that promotes vaporization with a high vaporization efficiency. In some implementations, process 900 includes process 800, e.g., temperature and/or pressure control in conjunction with pulsed liquid injection.

The process 900 includes providing a vapor of the liquid (generated using the vaporizer) into a chamber (904). For example, as shown in FIGS. 1 and 2, the vapor can be output through outlet port 210 and provided into chamber 112 through the vapor line 126. As discussed in reference to FIG. 6, in some implementations the vapor line 126 is at least partially surrounded by a vapor line heater 114 that is operated or controlled to heat the vapor line heater.

Referring to FIG. 1, in some implementations, the chamber 112 includes a pressure sensor 122 configured to sense an internal pressure of the chamber 112. In some implementations, signals from the pressure sensor 122 are provided to a controller (e.g., controller 124), and the controller, based on the chamber pressure, adjusts one or more process parameters, such as push pressure, pulse on-time, and/or pulse off-time, in order to achieve a target pressure in the chamber 112. Instead or additionally, the pressure sensor 122 can be connected to a switch 140 that enables or disables one or more components of the material processing system 100 based on the pressure. For example, the switch 140 can enable the valve 116 (and/or another component, e.g., an outlet valve of a tank holding the gas used for pressurization) only if the chamber pressure is below a threshold value, e.g., 0.5 atm. The switch 140 can improve safety by preventing outgassing from the chamber 112.

The chamber 112 can be connected to a pump 118 via a foreline 142. The pump 118 can be configured to remove vapor from the chamber 112. In some implementations, one or more valves can enable/disable pumping of the chamber 112 by the pump 118. In some implementations, a foreline heater 120 at least partially surrounds the foreline 142. The foreline heater 120 (e.g., a heating jacket), which can be configured to maintain the foreline 142 at a temperature that prevents condensation of the vapor inside the foreline 142, e.g., a temperature in a range from 100° C. to 150° C., such as in a range from 120° C. to 140° C.

The chamber 112 includes a sample chuck 132 for holding a sample 130 on which processing is to be performed using vapor from the vaporizer 102. In some implementations, the chamber 112 includes one or more chamber heaters 144 that can be operated (e.g., by the controller 124) to maintain the internal temperature of the chamber within a target range. In some implementations, the chamber 112 includes a chamber temperature sensor 136 for outputting signals indicative of the internal temperature, e.g., to the controller 124 for use in controlling the chamber heaters 144.

The chamber 112 can additionally include further sample-handling and/or other components such as load-lock(s), transfer arm(s), a vent inlet, and/or the like. Also, it will be understood that the illustration of the material processing system 100 in FIG. 1 does not exclude the presence of additional or alternative components, such as additional valves, sensors, fluid-handling components, sample-handling components, gas sources, and/or the like. In some implementations, the material processing system 100 includes multiple vaporizers 102 connected to the same and/or different sources of liquid and connected to the chamber 112 and/or one or more other chambers.

Continuing in reference to FIG. 9, the process 900 includes performing material processing in the chamber using the vapor (906). For example, in some implementations, the vapor is formic acid vapor, and the sample 130 includes components to be bonded together using solder. For example, the sample can include a glass panel with tin contacts, the tin contacts to be bonded to chips. The controller 124 can control the material processing system 100 to maintain the chamber temperature in a range suitable for reflowing (e.g., at about 225° C., with the understanding that various different chamber temperatures can be used for various processes), and can control the valve 116 to deliver formic acid into the chamber 112. The formic acid vapor removes the native oxide from the tin surface. In some implementations, during solder reflow, the formic acid pressure in the chamber 112 is maintained in a range from 125 Torr to 175 Torr, with the understanding that various different chamber pressures can be used for various processes.

Materials of the material processing system 100 can be compatible with the liquid and vapor provided into and out of the vaporizer 102. In some implementations, the vaporizer 102 (e.g., plates 304, cover 202 and/or enclosure 206) are composed of aluminum and/or steel. In some implementations, the atomizer nozzle 352 is composed of steel. In some implementations, fluid lines of the material processing system 100 (e.g., lines 134, 126, and/or 120) are composed of steel. In some implementations, a diaphragm of the valve 116 is composed of a cobalt-based superalloy compatible with corrosive environments. In some implementations, the vessel 104 is composed of steel. Steel used in the material processing system 100 can be resistant to corrosion, e.g., corrosion by formic acid. For example, in some implementations, the steel includes 316L stainless steel.

As such, based on the foregoing systems, apparatuses, and processes, vapor may be generated and provided with a high flow-rate and with a high vaporization efficiency. For example, the use of pressurizers, atomizers, and/or tortuous paths can promote vaporization. In some implementations, the described vaporizers include long tortuous paths in an overall compact vaporizer to improve system form-factor. Further, in some implementations, the use of plates to form the tortuous path provides improved ease of manufacturing and/or repair. The delivered vapor can be provided with a high flow-rate for a corresponding high process throughput. By contrast, some alternative vaporizers are non-compact, which may have negative effects both in terms of general spatial efficiency (e.g., given limited space for processing tools) and for vapor provision in particular, because a close vaporizer-chamber distance may be desirable in order to reduce cooling, condensation, and/or other negative results of longer piping.

The term "computing system" as used in this disclosure may encompass all apparatus, devices, and machines for processing data, including by way of example a programmable processor, a computer, or multiple processors or computers. A processing system, such as the controller 124, can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, executable logic, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Computer readable media suitable for storing computer program instructions and data include all forms of non-volatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. Sometimes a server is a general-purpose computer, and sometimes it is a custom-tailored special purpose electronic device, and sometimes it is a combination of these things.

Implementations can include a back end component, e.g., a data server, or a middleware component, e.g., an application server, or a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The features described for the controller 124 can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

A number of implementations have been described. Nevertheless, it will be understood that various modifications may be made.

While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A vaporizer apparatus comprising:
   a liquid inlet;
   a plurality of plates in a stacked arrangement, the plurality of plates comprising openings and surfaces defining a tortuous path for a liquid through the plurality of plates,
   wherein the plurality of plates is configured to direct a flow of the liquid through the tortuous path from a first end corresponding to a first plate of the plurality of plates and output a vapor of the liquid at a second end of the tortuous path corresponding to a last plate of the plurality of plates; and
   at least one heating element configured to heat the plurality of plates to vaporize the liquid along its flow through the tortuous path and generate the vapor,
   wherein the plurality of plates comprises a first plurality of plates stacked in a first section, and a second plurality of plates stacked in a second section,
   wherein the first plurality of plates is laterally spaced apart from the second plurality of plates,
   wherein the first plurality of plates comprises openings and surfaces defining a first portion of the tortuous path, and
   wherein the second plurality of plates comprises openings and surfaces defining a second portion of the tortuous path.

2. The vaporizer apparatus of claim 1, wherein the plurality of plates are stacked with intervening spaces having a specified dimension.

3. The vaporizer apparatus of claim 1, wherein the plurality of plates comprise two plates in succession along the tortuous path, wherein the two plates are oriented parallel to one another and spaced apart along a stack direction, and
   wherein the two plates comprise respective openings arranged at different lateral positions.

4. The vaporizer apparatus of claim 3, wherein the respective openings of one of the two plates are arranged more radially inward compared to the respective openings of another of the two plates.

5. The vaporizer apparatus of claim 1, comprising an atomizer configured to atomize liquid from the liquid inlet and inject a spray of the liquid toward the first plate of the plurality of plates.

6. The vaporizer apparatus of claim 1,
   wherein the first plate is included in the first plurality of plates and is closest to the liquid inlet among plates of the first plurality of plates, and
   wherein the last plate is included in the second plurality of plates and is closest to the liquid inlet among plates of the second plurality of plates.

7. The vaporizer apparatus of claim 1, comprising a divider separating the first plurality of plates from the second plurality of plates,
   wherein the divider comprises an opening that defines a portion of the tortuous path.

8. The vaporizer apparatus of claim 1, comprising a divider separating the first plurality of plates from the second plurality of plates,
   wherein the divider comprises a slot to receive a first heating element of the at least one heating element.

9. The vaporizer apparatus of claim 1, wherein:
   (i) the first plurality of plates and the second plurality of plates include different numbers of plates,
   (ii) a total dimension of the first plurality of plates along a stack direction is different from a total dimension of the second plurality of plates along the stack direction, or
   (i) and (ii).

10. The vaporizer apparatus of claim 1, comprising an enclosure in which the plurality of plates are arranged, wherein an inner sidewall of the enclosure defines the tortuous path in conjunction with the plurality of plates.

11. The vaporizer apparatus of claim 1, wherein the first portion of the tortuous path extends from the first end of the tortuous path with a first overall flow direction; and wherein the second portion extends from the first portion to the second end of the tortuous path with a second overall flow direction, wherein the second overall flow direction is opposite to the first overall flow direction.

12. The vaporizer apparatus of claim 1, wherein the tortuous path switches from a first direction to a second direction opposite the first direction at least twenty times.

13. The vaporizer apparatus of claim 1, wherein a length, along a lateral direction, between opposite lateral edges of a volume defining the tortuous path is D, and wherein the tortuous path has a length at least 3D along the lateral direction.

14. The vaporizer apparatus of claim 1, wherein the vaporizer apparatus is configured to deliver the vapor to a chamber in the absence of a carrier gas.

15. The vaporizer apparatus of claim 1, wherein gas output from the vaporizer apparatus is at least 95% vapor of the liquid.

16. The vaporizer apparatus of claim 1, wherein the liquid inlet is the only fluid inlet of the vaporizer apparatus.

17. The vaporizer apparatus of claim 1, wherein the plurality of plates are separate components from one another.

18. A vaporizer apparatus comprising:
a liquid inlet;
a plurality of plates in a stacked arrangement, the plurality of plates comprising openings and surfaces defining a tortuous path for a liquid through the plurality of plates,
wherein the plurality of plates is configured to direct a flow of the liquid through the tortuous path from a first end corresponding to a first plate of the plurality of plates and output a vapor of the liquid at a second end of the tortuous path corresponding to a last plate of the plurality of plates; and
at least one heating element configured to heat the plurality of plates to vaporize the liquid along its flow through the tortuous path and generate the vapor,
wherein the plurality of plates comprise a first type of plate and a second type of plate, wherein the first type of plate and the second type of plate have openings in different lateral positions, and
wherein the first type of plate and the second type of plate alternate along the tortuous path.

19. The vaporizer apparatus of claim 18, wherein the openings in the first type of plate are arranged more radially inward compared to the openings in the second type of plate.

20. The vaporizer apparatus of claim 19, wherein the at least one heating element comprises a heating element extending through two or more of the plurality of plates.

21. The vaporizer apparatus of claim 18, comprising an atomizer configured to atomize liquid from the liquid inlet and inject a spray of the liquid toward the first plate.

22. The vaporizer apparatus of claim 18, wherein the vaporizer apparatus is configured to deliver the vapor to a chamber in the absence of a carrier gas.

23. A vaporizer apparatus comprising:
a liquid inlet;
a plurality of plates in a stacked arrangement, the plurality of plates comprising openings and surfaces defining a tortuous path for a liquid through the plurality of plates,
wherein the plurality of plates is configured to direct a flow of the liquid through the tortuous path from a first end corresponding to a first plate of the plurality of plates and output a vapor of the liquid at a second end of the tortuous path corresponding to a last plate of the plurality of plates; and
at least one heating element configured to heat the plurality of plates to vaporize the liquid along its flow through the tortuous path and generate the vapor,
wherein the at least one heating element comprises a cartridge heater extending through two or more of the plurality of plates.

24. The vaporizer apparatus of claim 23, wherein the plurality of plates are arranged in a first stack and a second stack spaced laterally apart from the first stack, and
wherein the cartridge heater extends through all plates in the first stack or the second stack.

25. The vaporizer apparatus of claim 23, wherein the plurality of plates comprise two plates in succession along the tortuous path, wherein the two plates are oriented parallel to one another and spaced apart along a stack direction, and
wherein the two plates comprise respective openings arranged at different lateral positions.

26. The vaporizer apparatus of claim 23, wherein the tortuous path comprises:
a first portion extending from the first end of the tortuous path with a first overall flow direction; and
a second portion extending from the first portion to the second end of the tortuous path with a second overall flow direction, wherein the second overall flow direction is opposite to the first overall flow direction.

27. A vaporizer apparatus comprising:
a liquid inlet;
a plurality of plates in a stacked arrangement, the plurality of plates comprising openings and surfaces defining a tortuous path for a liquid through the plurality of plates,
wherein the plurality of plates is configured to direct a flow of the liquid through the tortuous path from a first end corresponding to a first plate of the plurality of plates and output a vapor of the liquid at a second end of the tortuous path corresponding to a last plate of the plurality of plates; and
at least one heating element configured to heat the plurality of plates to vaporize the liquid along its flow through the tortuous path and generate the vapor,
wherein the vaporizer apparatus is configured to deliver the vapor to a chamber in the absence of a carrier gas, wherein the plurality of plates comprise two plates in succession along the tortuous path, wherein the two plates are oriented parallel to one another and spaced apart along a stack direction, and wherein the two plates comprise respective openings arranged at different lateral positions.

28. The vaporizer apparatus of claim 27, wherein gas output from the vaporizer apparatus is at least 95% vapor of the liquid.

29. The vaporizer apparatus of claim 27, wherein the liquid inlet is the only fluid inlet of the vaporizer apparatus.

* * * * *